United States Patent
Dighde et al.

(10) Patent No.: US 6,751,091 B2
(45) Date of Patent: Jun. 15, 2004

(54) MODULAR HOUSING FOR USE WITH TEST EQUIPMENT

(75) Inventors: Rajesh Dighde, Orefield, PA (US); William Joseph Thompson, Kempton, PA (US)

(73) Assignee: Circadiant Systems, Inc., Allentown, PA (US)

( * ) Notice: Subject to any disclaimer, the term of this patent is extended or adjusted under 35 U.S.C. 154(b) by 2 days.

(21) Appl. No.: 10/236,997

(22) Filed: Sep. 6, 2002

(65) Prior Publication Data

US 2004/0047116 A1 Mar. 11, 2004

(51) Int. Cl.[7] .................................................. G06F 1/16
(52) U.S. Cl. ........................ 361/683; 361/825; 312/323; 246/200.1
(58) Field of Search ............................... 361/680, 681, 361/683, 724–727; 312/7.2, 223.1, 223.2, 223.3, 242, 243, 245, 270.2, 321.5, 138.1, 324, 326, 234, 234.3; 248/264, 948, 917, 919, 268, 200.1, 274.1, 284.1, 286.1, 291.1, 298.1, 222.41, 324, 265, 269, 251; 348/552, 836; 174/38, 39, 50, 52.1, 37; 211/41.17, 41.18, 26, 182, 184, 191, 194

(56) References Cited

U.S. PATENT DOCUMENTS

| | | | | |
|---|---|---|---|---|
| 3,756,677 A | * | 9/1973 | Gosswiller | 312/108 |
| 5,126,724 A | * | 6/1992 | Feuerlein et al. | 345/168 |
| 5,228,763 A | * | 7/1993 | Gingold | 312/266 |
| 5,482,232 A | * | 1/1996 | Wynn et al. | 248/27.1 |
| 5,646,819 A | * | 7/1997 | Hill, III | 361/683 |
| 5,747,734 A | * | 5/1998 | Kozlowski et al. | 174/50 |
| 6,060,979 A | * | 5/2000 | Eichsteadt | 340/287 |
| 6,193,341 B1 | * | 2/2001 | Eizadkhah et al. | 312/323 |
| 6,229,691 B1 | * | 5/2001 | Tanzer et al. | 361/622 |
| 6,353,532 B1 | * | 3/2002 | Landrum et al. | 361/683 |
| 6,442,030 B1 | * | 8/2002 | Mammoser et al. | 361/727 |
| 6,462,961 B1 | * | 10/2002 | Johnson et al. | 361/825 |
| 6,585,203 B1 | * | 7/2003 | Euker | 248/200.1 |
| 6,618,250 B2 | * | 9/2003 | Nealis | 361/704 |

* cited by examiner

Primary Examiner—Michael Datskovsky
(74) Attorney, Agent, or Firm—Volentine Francos, PLLC

(57) ABSTRACT

A modular housing device includes a modular housing having a first side and a second side, at least one component disposed with said modular housing. The modular housing device further includes a bracket disposed on the second side.

20 Claims, 6 Drawing Sheets

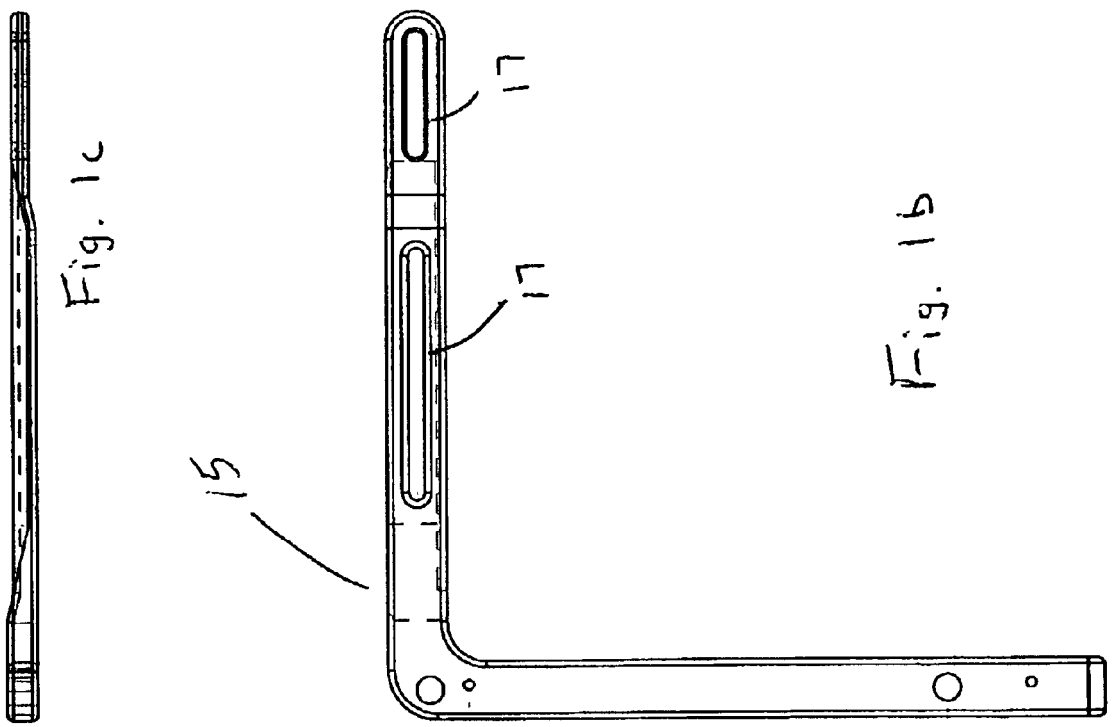

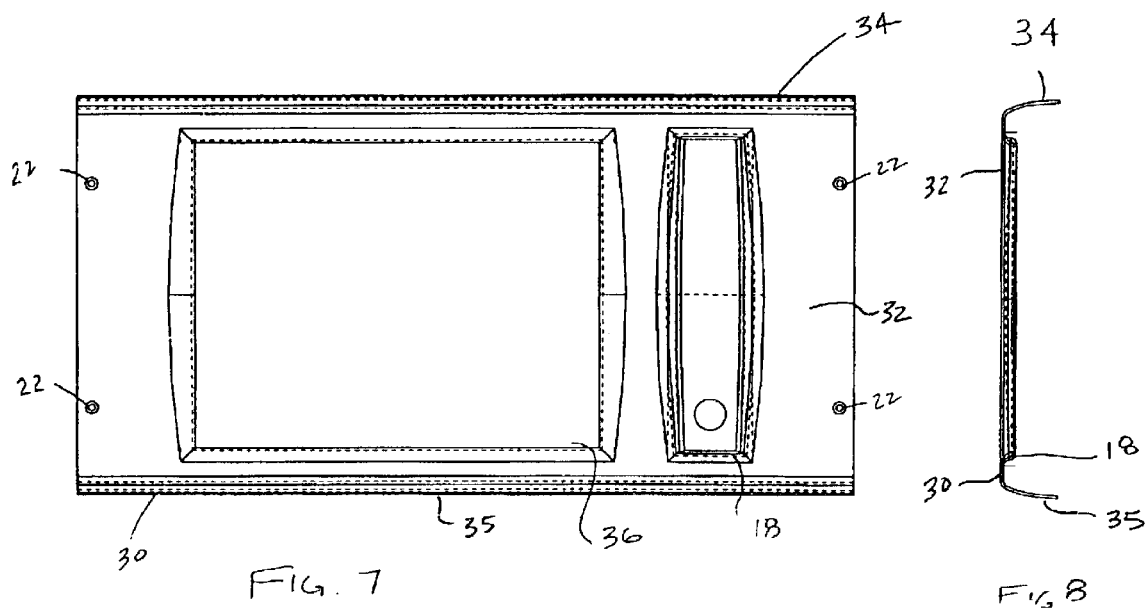
FIG. 7
FIG. 8
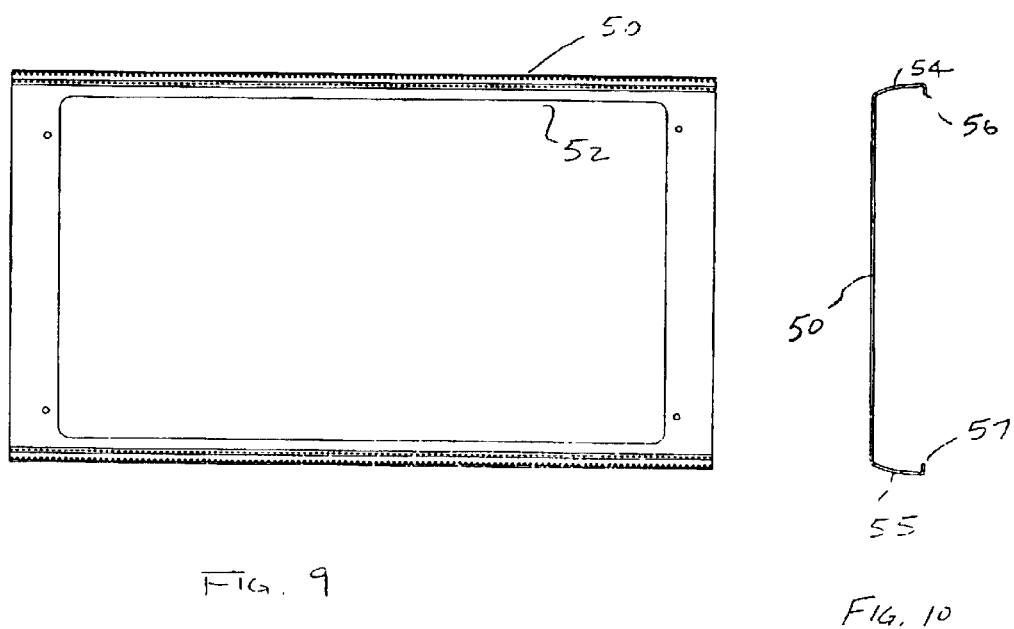
FIG. 9
FIG. 10

US 6,751,091 B2

MODULAR HOUSING FOR USE WITH TEST EQUIPMENT

FIELD OF THE INVENTION

The present invention relates generally to test equipment, and more particularly to a modular electrical system housing for use in a variety of applications and settings.

BACKGROUND

Test equipment is used in a variety of applications. For example, optical and electrical components, subsystems and systems often require testing during manufacture and when deployed. Typical test equipment is rack-mounted in the manufacturing setting, and the devices under-test are located near the rack for testing purposes.

The test equipment often requires complex and sensitive calibration. Moreover, the racks on which typical test equipment is disposed may be large and cumbersome. As such, the rack-mounted test equipment is difficult to move from one location to another to effect testing. Accordingly, testing of deployed devices, subsystems and systems may be impaired by the drawbacks of known rack-mounted test equipment. Moreover, in a manufacturing environment, it may be desirable to include mobility to the desired characteristics of test equipment. Summary In accordance with an exemplary embodiment of the present invention, a modular housing device includes a modular housing having a first side and a second side, and at least one component disposed within the modular housing. The modular housing device further includes a bracket disposed on the second side.

BRIEF DESCRIPTION OF THE DRAWINGS

The invention is best understood from the following detailed description when read with the accompanying drawing figures. It is emphasized that the various features are not necessarily drawn to scale. In fact, the dimensions may be arbitrarily increased or decreased for clarity of discussion.

FIG. 1b is a perspective view of a bracket used in mounting the modular housing in accordance with an exemplary embodiment of the present invention.

FIG. 1c is a side view of the bracket shown in Fig. 1b.

FIG. 7 is a front view of a composite shell used in the modular housing in accordance with an exemplary embodiment of the present invention.

FIG. 8 is a side view of the composite shell of FIG. 7.

FIG. 9 is a front view of a metallic lining used in the composite shell shown in FIG. 7.

FIG. 10 is a side view of the metallic lining shown in FIG. 9.

DETAILED DESCRIPTION

Figure 1A:
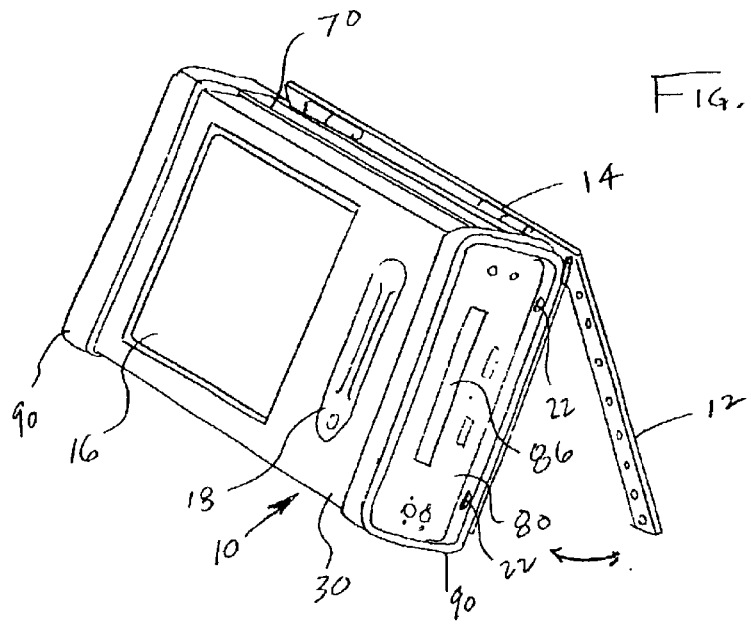
FIG. 1a is a perspective view of a first embodiment of a modular housing in accordance with an exemplary embodiment of the present invention.

In the following detailed description, for purposes of explanation and not limitation, exemplary embodiments disclosing specific details are set forth in order to provide a thorough understanding of the present invention. However, it will be apparent to one having ordinary skill in the art having had the benefit of the present disclosure, that the present invention may be practiced in other embodiments that depart from the specific details disclosed herein. Moreover, descriptions of well-known devices, methods and materials may be omitted so as to not obscure the description of the present invention.

Moreover, certain terminology is used in the following description for convenience only and is not considered limiting. Words such as "front", "back", "top" and "bottom" designate directions in the drawings to which reference is made. This terminology includes the words specifically noted above, derivatives thereof and words of similar import. Additionally, the terms "a" "and" "one" are defined as including one or more of the referenced item unless specifically noted.

Figure 2:
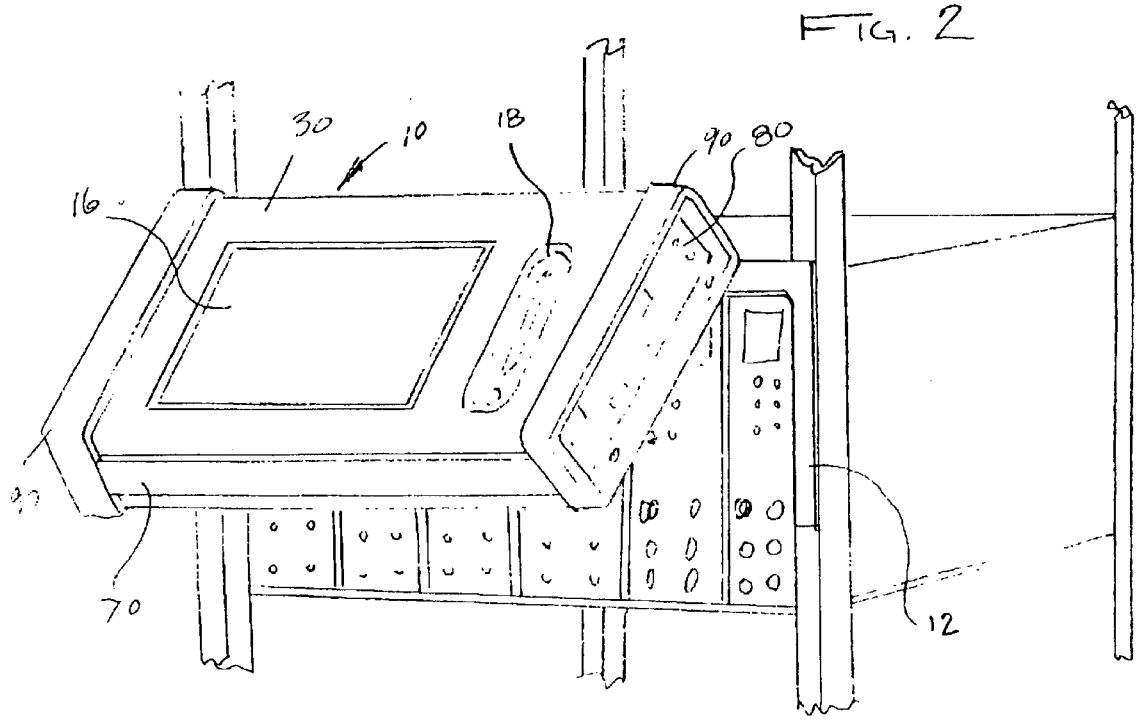
FIG. 2 is a perspective view of the modular housing in accordance with an exemplary embodiment of the present invention shown mounted on a rack assembly.

FIGS. 1a and 2 show a modular housing 10 in accordance with an exemplary embodiment of the present invention. The modular housing 10 is illustratively for optical components, or electrical components, or both. These components may be used for test equipment used for optical testing, electrical testing, or both. The specific electrical and optical components, both passive and active, are well known to one of ordinary skill in the art. As such, further details of these components are not included on the interest of clarity of discussion of the exemplary embodiments of the present invention. It is further noted that the use of the modular housing 10 for housing test equipment is merely illustrative. Clearly, other types of components and elements may be disposed within the modular housing 10 to achieve other desired ends.

The modular housing 10 may be provided in a stand-alone configuration, and may include a bracket 12. The bracket 12 may be pivotably connected with a hinge 14 to the modular housing 10. In the illustrative embodiment shown in FIGS. 1a and 2, the modular housing 10 is illustratively used in connection with test equipment for networks or other modular systems; or platforms used in data and/or audio or visual signal transmission, and/or storage via optical signals, electrical signals, or both. A display 16, illustratively a touch screen (e.g., a touch screen liquid crystal display (LCD)) is provided in the modular housing 10; and a recess 18 is provided for a stylus, which may be used in connection with the touchscreen.

Figure 11:
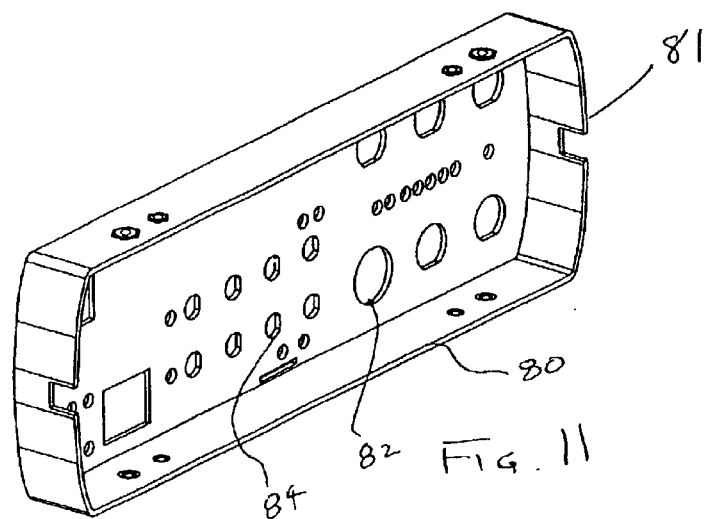
FIG. 11 is a perspective view of a connection panel in accordance with an exemplary embodiment of the present invention.
Figures 12, 13:
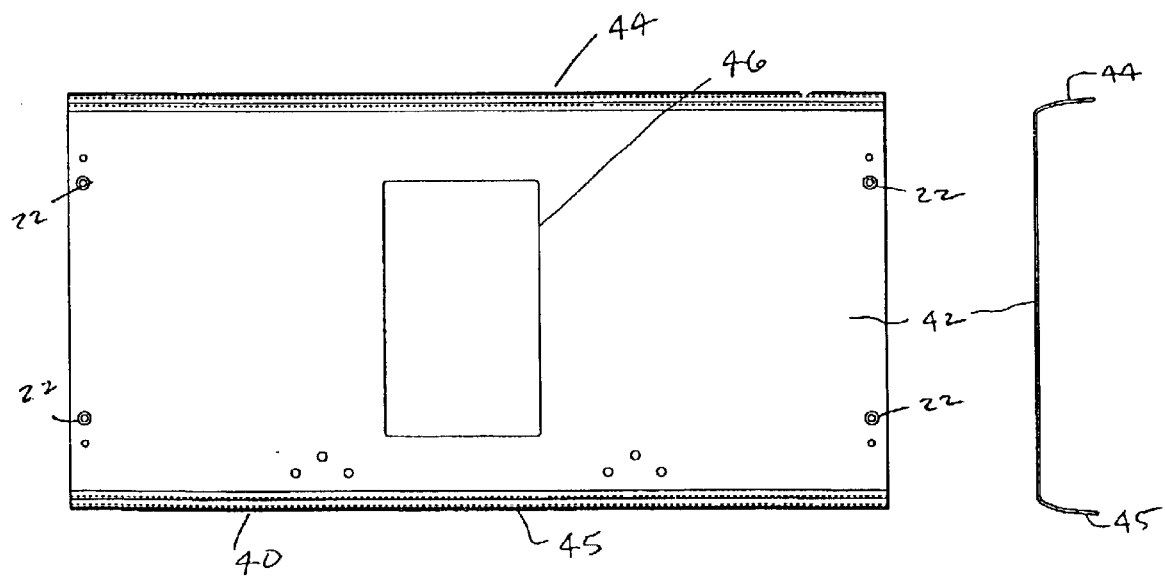
FIG. 12 is an front view of a composite shell in accordance with an exemplary embodiment of the present invention.
FIG. 13 is a side view of the composite shell shown in FIG.12.

At each opposing side, the modular housing 10 has a connection panel 80. An illustrative connection panel 80 is shown in perspective view in FIG. 11 and may have various cut-outs 82, 84 and holes for making connections to the electronic and/or optical components located within the modular housing 10, 20. Electrical connections or optical connections, or both, may be selectively made via suitable electrical and/or optical connectors disposed in openings in the connection panel 80. These connectors are coupled to components with the modular housing 10. The specific shape and size of the cut outs 82, 84 will depend upon the particular application and the components located within the modular housing 10, 20. Moreover, the types of connectors used are those within the purview of one of ordinary skill in the art. It is further noted that if a CD-RW drive is located within the modular housing 10, an enlarged cut out 86 (shown in FIG. 1a) may be provided for the insertion of a CD. Of course, the use of the CD-RW drive is merely illustrative, and it is noted that other types of external memory read-write devices may be used (e.g., magnetic disc drives).

The connection panels 80 are illustratively recessed such that the fasteners 22 may be located through the ends 81 (see FIG. 1) thereof and through the ends of the composite shells, 30, 40. An end cover 90 may be disposed over the ends 81 of the connection panels 80 as shown in FIG. 1a. The fasteners 22 are usefully disposed in holes through the end covers 90 and ends 81, allowing the connection of adjacent modular housings 10 together or to a rack.

FIG. 1b shows one of the generally 'L'-shaped arms 15 that may be connected to another thereof to form the bracket 12, which is illustratively U-shaped. The bracket 12 is connected to hinges 14. The hinges 14 enables the modular housing to rotate for example as shown by the arrow in FIG. 1a. The two arms of the U-shaped bracket 12 are connected to the modular housing 10 by fasteners at the ends of the modular housing.

This pivoting aspect of the bracket 12 fosters a great deal of versatility of the modular housing 10. For example, when pivoted the bracket 12 may be used as a stand for the modular housing having test equipment therein. As such, the test equipment may be portably disposed in a generally upright position, enabling easy access to a display 16, and various electrical and optical connectors disposed on the connection panels 80. It is noted that a handle (not shown) or other suitable device for carrying the modular housing 10 alone or in combination with an another (or more) attached modular housings may be disposed on the modular housing 10.

The bracket 12 also may be used to connect the modular housing 10 (and the test equipment) to a rack 19 as shown in FIG. 2. The rack 19 may be a rack used to hold test equipment in a manufacturing setting, or may be another type of rack. The bracket 12 is used to connect the modular housing 10 to the rack 19 in a versatile and efficient manner. The L-shaped arms 15 of the bracket 12 have slots 17 therein which receive fasteners therein. The slots allow the width of the bracket to be adjusted by sliding the arms inwardly or outwardly along the slot 17 with fasteners therein. Once a desired width is achieved, the bracket is fixed in place by a fastening mechanism (not shown). Finally, the bracket 12 may be used to connect a first housing to a second housing in a dual pivoting manner, as shown and described in connection with the exemplary embodiment of FIG. 3

Advantageously, because the bracket 12 has a variable width, the test equipment may be connected/mounted to a variety of fixtures in a variety of settings. Illustratively, because of the variable width of the bracket, the test equipment within the modular housing 10 may be connected to other similar units or racks that have differing widths.

In brief summary of illustrative uses, the modular housing 10 may be connected to another similar modular housing (not shown in FIG. 1) via the bracket 12. (This configuration is shown and described in additional detail in connection with the exemplary embodiment of FIGS. 3 and 4). This connection of two (or more) modular housings fosters the expandability of functions and/or capacity of the test equipment. For example, if added functionality is desired, another modular housing, which includes the desired functionality, may be connected to the modular housing 10 by the bracket 12. It is noted that the connection of one modular housing to another via brackets may be continued allowing a plurality of modular housings may be connected using respective brackets disposed on the respective rear sides thereof. Alternatively, fasteners 22 may be used to connect a plurality of modular housings together as shown in FIG. 4. Finally, the bracket 12 may be in a fixed pivoted-position, allowing the modular housings be disposed a stand-like configuration (see FIG. 1a for example). This is useful when portability of the test equipment is desired, for example.

Figure 3:
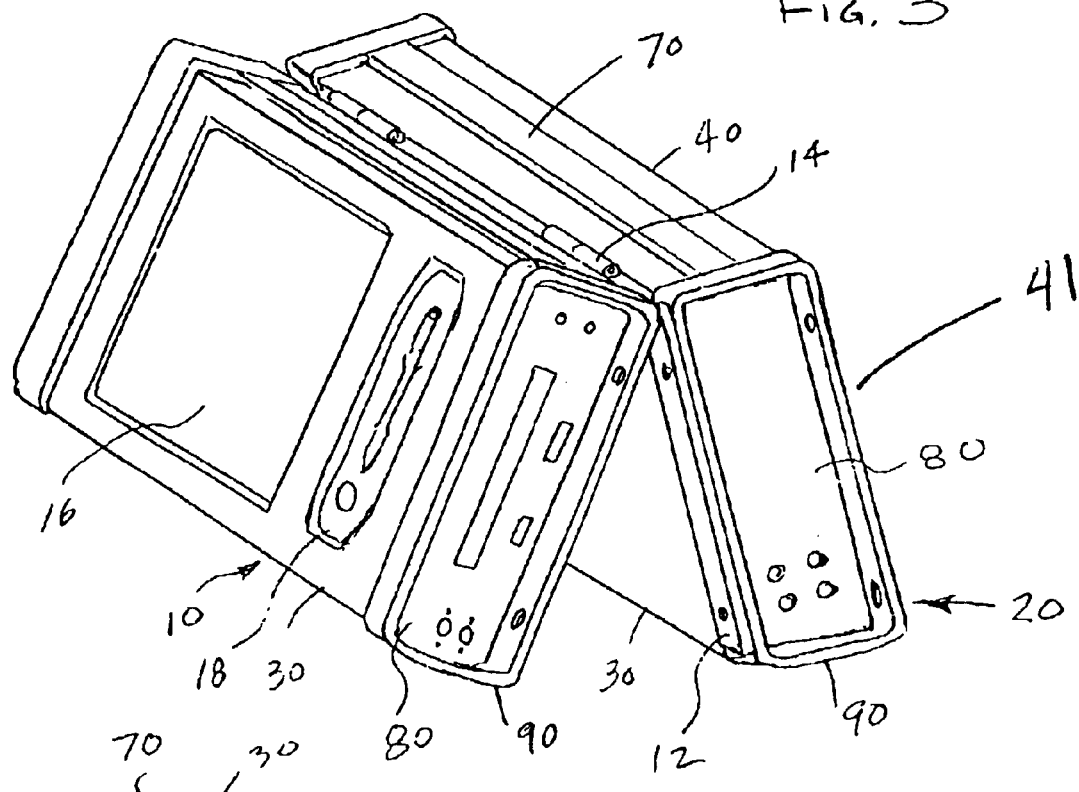
FIG. 3 is a perspective view of two modular housings in accordance with an exemplary embodiment of the present invention in pivotable stand-alone configuration.
Figure 4:
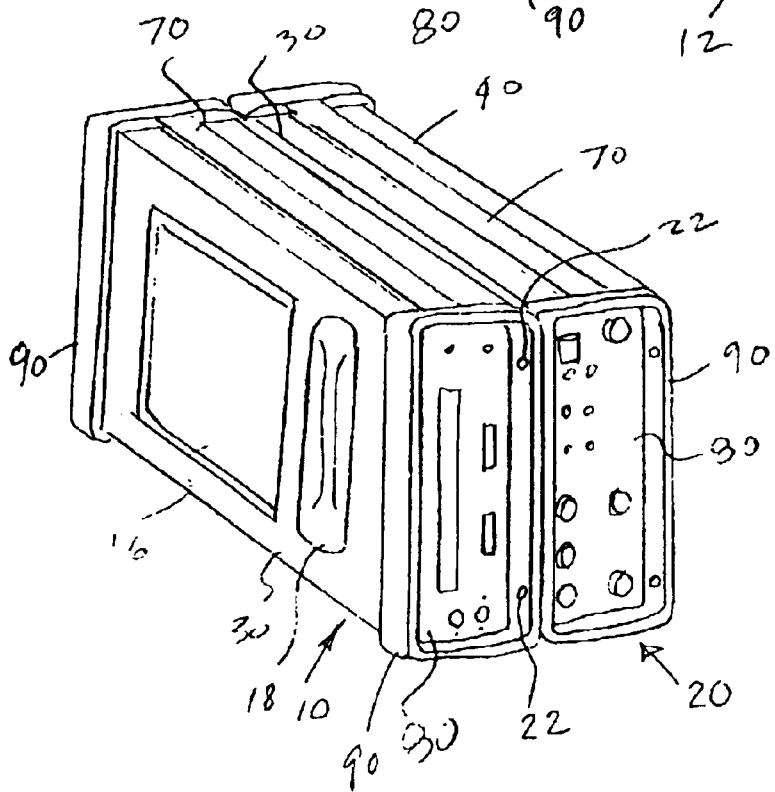
FIG. 4 is a perspective view of two modular housings in accordance with an exemplary embodiment of the present invention.

FIGS. 3 and 4 show electronics equipment utilizing the modular housing 10 in accordance with an illustrative embodiment of the present invention. As shown in FIG. 3, and as referenced previously, the modular housing 10 is pivotally connected, to a second modular housing 20. The second modular housing is substantially the same as modular housing 10, although this is not necessarily the case. In fact, the second modular housing 20 may be different than the modular housing 10. It is noted that there is no requirement that the functionality of the components within the modular housings 10, 20, be the same. Common to both modular housings 10, 20, however, is the adaptability for coupling via the bracket 12.

The illustrative embodiment shown in FIGS. 3 and 4 provides for ease of use for portable electronic equipment, such as test equipment, which is carried (by a handle that is not shown) from site to site by a user. This exemplary embodiment allows the equipment to be set up in an easy to use configuration with the display 16 facing upwardly for easier viewing. Moreover, easy access to the connectors is provided via the connection panels 80. Additional modular housings (not shown) may be attached in a stacked arrangement. To wit, a plurality of modular housings may be connected end-to-end by fasteners connected to the respective sides 41 of the housings. These may be mounted on a rack, or may be portable as a stand-alone device.

The ability to readily connect a desired number of modular housings may be useful in increasing the functionality, or capacity, or both of the equipment within the respective housings. To this end, the functionality may be altered or increased by adding a particular type of equipment via an additional module housing(s). The capacity may be similarly increased.

One particular advantage of a configuration of stacked module housings having certain equipment therein can be readily appreciated by way of example. If a number of parallel measurements are needed using known test equipment, a rack of test equipment will be required for each test to be carried out. For example, it is common to run certain measurements and test on six optical channels in an optical system. Using known test methods, six racks of test equipment would be needed. Using the bracket /modular housing arrangement just described, one modular housing for each channel could be used. These modular housings 20 could be connected to one another via fasteners 22 and the last one would placed on a rack shelf (not shown). As such, instead of six separate racks of test equipment, one rack with six connected modular housings 10, 20 would be needed. The display 16 of the outermost modular housing 10 would be used as the display for all six channels; and necessary connections would be made between the modular housings via the connectors on the connection panel 80.

FIG. 4 shows how two modular housings 10, 20 may be connected directly together utilizing fasteners 22, which may be pre-mounted in specified locations on the modular housings 10 and 20 in order to allow separate modular housings 10, 20 to be connected together to suit particular test equipment configuration needs.

Referring now to FIGS. 5–13, the construction details for the modular housings 10, 20 in accordance with exemplary embodiments of the present invention are shown in detail. Each modular housing 10, 20 include first and second composite shells 30, 40. Each of the first and second composite shells 30, 40 has a generally planar major surface 32, 42 and first and second opposing sides 34, 35 and 44, 45, respectively, which extend generally normal to the respective major surface 32, 42.

One exemplary embodiment of the first composite shell 30 is shown in detail in FIG. 7, and includes a cut-out 36 for the display 16 as well as the recess 18 for the stylus. Fasteners 22 such as inserts, which may be threaded, are usefully installed at fixed locations in the modular housing 10. Additionally, the fasteners 22 are also provided in aligned positions on the first and second composite shells 30, 40 such that multiple modular housing may be directly connected together, for example, as shown in FIG. 4.

Both the first and second composite shells 30, 40 are illustratively fabricated from a selected composite material fabric with an adhesive matrix in soft tooling. The adhesive matrix may be activated, such as by heat in the case of a heat setting epoxy or a thermo-formable resin, so that the composite material is bonded together to form each composite shell 30, 40. The composite material may be comprised of woven graphite fibers and/or woven fiberglass fibers and/or woven kevlar fibers, which may be pre-impregnated or coated with a heat curable epoxy resin system or a thermoplastic resin system. The shells 30, 40 are illustratively stacked individual plies of material which are illustratively vacuum bagged against the tool to withdraw air from the composite shell such that the individual plies are drawn together as the resin is activated and cured to form each composite shell 30, 40. The shells 30, 40 are illustratively formed oversized and trimmed to net size after the resin matrix is cured. Cut-outs and holes, such as for the fasteners 22, are then added in a separate operation, such as by water jet cutting, laser cutting or machining. The particular size and shape of the composite shells 30, 40 for a given application may be varied.

A first metallic lining 50, shown in detail in FIGS. 9 and 10, is connected inside the first composite shell 30. The first metallic lining 50 is illustrated as including a large cut out 52 for use in connection with the cut out 36 for the display as well as the recess 18 for the stylus in one exemplary embodiment of the modular housing 10. However, it will be recognized by those skilled in the art from the present disclosure that the large cut out 52 is not required and that various size and shapes of cut outs could be utilized depending on the particular configuration of the composite shells 30, 40. The metallic lining includes first and second opposing sides 54, 55, which correspond generally to the first and second opposing sides 34, 35 or 44, 45 of the respective first and second composite shells 30, 40. A connector portion 56, 57 is located on each end of the opposing sides 54, 55 of the first metallic lining 50 and is dimensioned to extend beyond the first and second opposing sides 34, 35, 44, 45 of the composite shells 30, 40, when the first metallic lining 50 is installed. The connector portions 56, 57 are illustratively in the form of a bent-up flange. A similar second metallic 50 lining is installed inside the second composite shell 40, but illustratively includes a smaller cut out which corresponds to the cut out 46 in the second composite shell 40, or no cut-outs, depending upon the particular housing configuration. Those skilled in the art will recognize that the use of, and size and shape of any cut-outs in the first or second composite shells will depend on the particular equipment and application. Usefully, the first metallic lining 50 is bonded to the first composite shell 30 and the second metallic lining 50 is also bonded to the second composite shell 40. This may be done in using any suitable adhesive.

Figure 5:
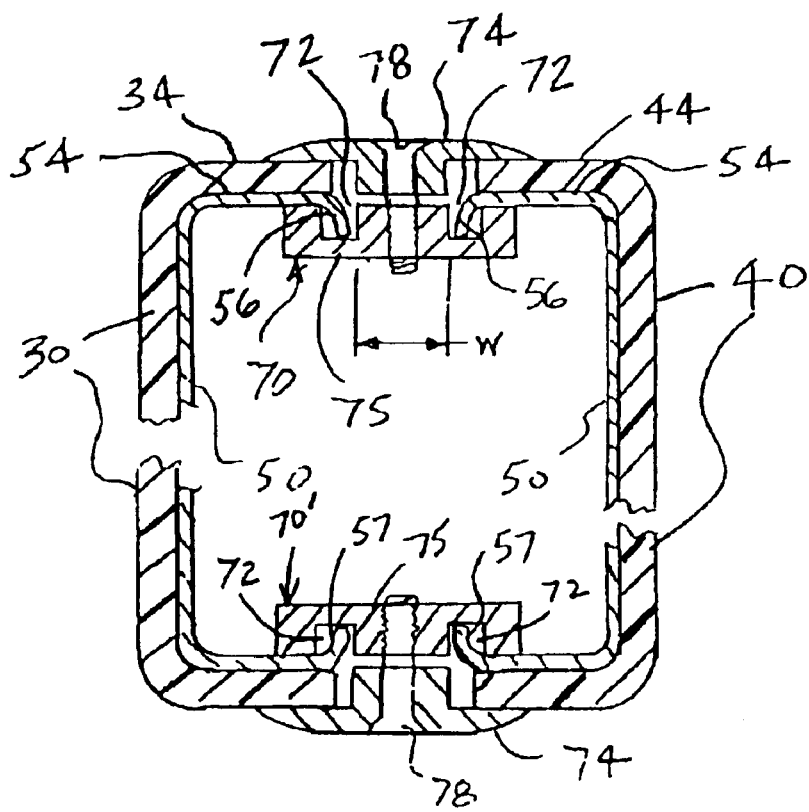
FIG. 5 is a cross-sectional view through a modular housing in accordance with an exemplary embodiment of the present invention.

Referring now to FIG. 5, the assembly of the modular housing 10 will be described in detail. A first connector bar 70 has a selected adjustable width, which is defined by the distance between the recesses 72, and is connected to the connector portions 56 of each of the metallic linings 50 which extend beyond the first opposing sides 34, 44 of the first and second composite shells 30, 40. A second connector bar 70' is connected to the connector portions 57 of the first and second metallic linings 50 which extend beyond the second opposing sides 35, 45 of the first and second composite shells 30 and 40, respectively, to hold the composite shells 30, 40 together to form two open ends.

Illustratively, the connector bars 70 are formed by an outer clamp portion 74 which overlies a portion of an outside surface of the first opposing sides 34, 44 of the first and second composite shells 30, 40 and an inner clamp portion 75, which engages with the connector portions 56 and 57 of the first and second metallic linings 50. At least one fastener, such as a threaded fastener 78 is used to connect the inner and outer clamp portions 74, 75 together. It is noted that the connector bars 70 are made illustratively from a metallic material and provide continuity between the first and second metallic linings 50. Moreover, connection panels 80 are connected in the open ends of the modular housing 10, 20. Beneficially, the connection panels 80 are made of a metallic material, such as aluminum, and together with the metallic linings 50, the connection panels 80 provide electromagnetic interference (EMI) shielding for electronic components within the modular housing 10. As shown in FIGS. 1–4, protective end covers 90, which may be made of a rubber or polymeric material are illustratively located over the connection panels 80 and the end of the modular housing 10, 20 to protect the edges from damage, to prevent injury to a user from a sharp edge being exposed, and to dampen shock and vibration to the modular housings 10,20.

The width ('W' in FIG. 5) of the connector bar 70 may be varied with relative ease. By varying the width of the connector bar 70 as defined between the recesses 72 for receiving the connector portions 56, 57 of the first and second metallic linings 50, the size of the modular housing 10 in accordance with the present invention can be varied in order to accommodate various electronic components. This variability of the width of the connector bar 70 provides significant advantages. For example, it may be desirable to alter/increase the functionality of the device within the modular housing 10. This may require, in turn, additional components that require more space than is provided by the present housing. Normally, this would require discarding the housing, at least. However, in accordance with the presently described exemplary embodiment, the additional components may be added by increasing the volume of the modular housing by increasing the width of the connector bar. This can be effected without sacrificing shielding.

Figure 6:
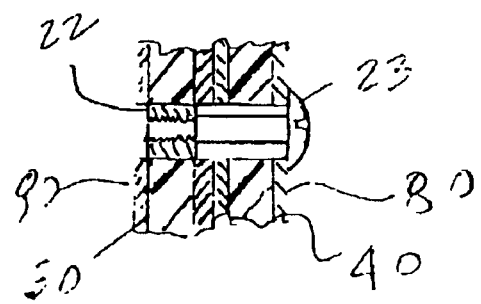
FIG. 6 is a cross-sectional view of a portion of modular housings shown in FIG. 4 illustrating the connection between the housings.

Referring to FIG. 6, an example of a threaded fastener 22 being passed through a hole and into an insert along the edges of the housing is shown. The fastener may be a screw 23 or may be any other suitable type of fastener.

The present invention as described through illustrative embodiments provides the advantage of a modular housing 10, 20 which is both impact damage resistant and which can be manufactured inexpensively utilizing soft tooling for making the composite shells 30, 40 by laying up the selected composite material fabric with the adhesive matrix in the soft tooling. Once the adhesive matrix is activated to form the composite shell, such as by heating, the composite shells 30, 40 may be trimmed to a desired size prior to bonding the metallic linings 50 within the composite shells 30, 40. The metallic linings 50 illustratively covered substantially all of the major surfaces 32, 42 and opposing sides 43, 35, 44, 45 of each of the composite shells 30, 40, respectively. The first and second composite shells 30, 40 may then be connected together utilizing two connector bars 70 which contact at least the metallic linings 50 of each of the composite shells 30, 40. Connection panels 80 are then attached to form the modular housing 10. The bracket assembly 12, shown in FIGS. 1a–3, allows the modular housing 10 to be arranged in an upwardly tilted position as a stand alone unit, as shown in FIG. 1a, connected to a rack to form a pivotable front mount unit for the rack, as shown in FIG. 2, or connected to a second modular housing to form a dual pivoting unit, as shown in FIG. 3. This single arrangement therefore allows for multiple uses. Multiple units may also be connected directly together utilizing fasteners, illustratively as shown in FIG. 4.

This modular housing 10, 20 therefore provides both flexibility and reduced cost from a manufacturing standpoint by allowing the same composite shells 30, 40 to be used to form modular housings of different sizes, depending on the width W of the connector bar. The use of soft tooling for laying up composite shells also allows for inexpensive production of high impact resistant shells for the modular housing, which results in better protection for the electronic components typically provided therein. Due to this improved impact resistance, the modular housing is maintained in better condition throughout the service life of the electronic components located therein.

The invention having been described in detail in connection through a discussion of exemplary embodiments, it is clear that modifications of the invention will be apparent to one having ordinary skill in the art having had the benefit of the present disclosure. Such modifications and variations are included in the scope of the appended claims.

What is claimed is:

1. A modular housing device, comprising;
    a modular housing having a first shell including a first side and a second shell including a second side, said shells being adjustably connected to each other;
    at least one component disposed within said modular housing; and
    a bracket disposed on said second side.

2. A modular housing device as recited in claim 1, wherein said components are chosen from the group consisting essentially of: electrical components and optical components.

3. A modular housing device as recited in claim 1, wherein said bracket is pivotable.

4. A modular housing device as recited in claim 1, wherein another modular housing device is connected to the modular housing device.

5. A modular housing device as recited in claim 1, wherein said modular housing is connected to a rack.

6. A modular housing device as recited in claim 1, wherein said first side has a display disposed thereon.

7. A modular housing device as recited in claim 1, wherein said connector bar is of variable size, and a volume of said modular housing is variable.

8. A modular housing device as recited in claim 1, wherein said modular housing has a first end and a second end, each of which have an connection panel; and
    at least one of said connection as panels has at least one connector therein.

9. A modular housing device as recited in claim 8, wherein said at least one connection panel has a plurality of connectors therein.

10. A modular housing device as recited in claim 9, wherein said connectors are chosen from the group consisting essentially of: optical connectors, electrical connectors, and disc drive interfaces.

11. A modular housing device as recited in claim 2, wherein said components comprise a testing device.

12. A modular housing device as recited in claim 11, wherein said testing device is an optical testing device.

13. A modular housing device as recited in claim 11, wherein said bracket is pivotable, and said modular housing is connected to another modular housing in a stand-alone manner.

14. A modular housing device as recited in claim 1, further comprising at least one other modular housing connected to said second side.

15. A modular housing device as recited in claim 1, wherein said bracket is adapted to connect the modular housing device to another element.

16. A modular housing device as recited in claim 15, wherein said another element is another modular housing device.

17. A modular housing device as recited in claim 15, is wherein said another element is a rack.

18. A modular housing device, comprising:
    a modular housing having a first shell including a first side and a second shell including a second side;
    a connector bar connecting said first and second shells;
    at least one component disposed within said modular housing; and
    a bracket disposed on said second side.

19. A modular housing device, comprising:
    a modular housing having a first side and a second side;
    said housing further having a first end and a second end, each of which have a connection panel;
    at least one of said connection panels has at least one connector therein;
    at least one component disposed within said modular housing; and
    a bracket disposed on said second side.

20. A modular housing as recited in claim 19, wherein said bracket further comprises at least one slot that is adapted for increasing or decreasing said width.

* * * * *